(12) United States Patent
Frederick, Jr.

(10) Patent No.: US 8,352,815 B2
(45) Date of Patent: Jan. 8, 2013

(54) CIRCUIT AND METHOD OPERABLE IN FUNCTIONAL AND DIAGNOSTIC MODES

(75) Inventor: Marlin Frederick, Jr., Cedar Park, TX (US)

(73) Assignee: ARM Limited, Cambridge (GB)

( * ) Notice: Subject to any disclaimer, the term of this patent is extended or adjusted under 35 U.S.C. 154(b) by 1786 days.

(21) Appl. No.: 11/582,517

(22) Filed: Oct. 18, 2006

(65) Prior Publication Data
US 2008/0115025 A1    May 15, 2008

(51) Int. Cl.
*G01R 31/28* (2006.01)
(52) U.S. Cl. ........................ 714/726; 327/202
(58) Field of Classification Search .................. None
See application file for complete search history.

(56) References Cited

U.S. PATENT DOCUMENTS

| | | | |
|---|---|---|---|
| 4,495,629 A * | 1/1985 | Zasio et al. ...................... 377/70 |
| 5,636,228 A * | 6/1997 | Moughanni et al. .......... 714/726 |
| 5,717,700 A * | 2/1998 | Crouch et al. ................. 714/726 |
| 5,867,507 A * | 2/1999 | Beebe et al. ................... 714/726 |
| 5,911,039 A * | 6/1999 | Hashizume et al. ............. 714/30 |
| 6,380,780 B1 | 4/2002 | Aitken et al. |
| 6,389,566 B1 * | 5/2002 | Wagner et al. ................ 714/726 |
| 7,091,742 B2 * | 8/2006 | Ryan ................................ 326/27 |
| 7,274,234 B2 * | 9/2007 | Branch et al. .................. 327/203 |
| 7,386,775 B2 * | 6/2008 | Birmiwal et al. .............. 714/729 |
| 7,650,549 B2 * | 1/2010 | Branch et al. .................. 714/731 |
| 2006/0152268 A1 * | 7/2006 | Flynn et al. .................... 327/218 |
| 2008/0016417 A1 * | 1/2008 | Sinha et al. .................... 714/718 |

* cited by examiner

*Primary Examiner* — Steve Nguyen
(74) *Attorney, Agent, or Firm* — Nixon & Vanderhye P.C.

(57) ABSTRACT

The application discloses a circuit comprising at least one flip flop, said flip flop comprising: a master latch and a slave latch; a data signal input and a scan signal input arranged in parallel to each other and each input comprising a tristateable device; and a scan enable signal input, a functional clock signal input and a scan clock signal input; wherein: in response to a first predetermined value of said scan enable signal indicating a functional mode of operation, said scan input tristateable device is operable to isolate said scan input from said master latch, and said master latch is operable in response to said functional clock to receive data from said data input and to output data to said slave latch and said slave latch is operable in response to said functional clock to receive data from said master latch and to output data at said data output; and in response to a second predetermined value of said scan enable signal indicating a scan mode of operation said data input tristateable device is operable to isolate said data input from said master latch, and said master latch is operable in response to said scan clock to receive data from said scan input and said slave latch is operable in response to said functional clock to receive data from said master latch and to output data at said scan output.

18 Claims, 6 Drawing Sheets

Two-Latch Clocked Scan Flop (variation 1)

Mux-D Flop

Three-Latch Clocked Scan Flop

Two-Latch Clocked Scan Flop

Two-Latch Clocked Scan Flop Waveforms

Two-Latch Clocked Scan Flop (variation 1)

Two-Latch Clocked Scan Flop (variation 2)

CIRCUIT AND METHOD OPERABLE IN FUNCTIONAL AND DIAGNOSTIC MODES

TECHNICAL FIELD

This technology relates to the field of data processing systems, and more particularly, to the field of diagnostic testing of circuits.

BACKGROUND

In order to test integrated circuits effectively it is known to provide diagnostic features on the circuit such as scan cells. Scan cells allow scan testing of the circuit to be performed which allows for the control and observation of state elements within the integrated circuit. Scan cells are generally provided in association with flip-flops or latches on the circuit by adding a scan cell capability to the design whereby a signal value may be captured and then serially scanned out of the circuit for diagnostic purposes.

Providing flip flops with a scan cell capability can be done in a number of ways. A common way is to provide a multiplexed flip-flop, which has a multiplexer on its input and output which can select between data and scan inputs in response to a control signal (scan enable). FIG. 1 shows such a multiplexed D flop 10 according to the prior art.

This flop comprises data and scan inputs 22 and 32 respectively. These inputs comprise respective tristatable devices 24 and 34 controlled by the scan enable signal. Thus, if scan is enabled, data input 22 is isolated from forward data path 25 running from data input 22 to data output 29, while if scan is not enabled, scan input 32 is isolated by tristate device 34 from the forward data path 25. The multiplexed D flop is otherwise a standard flop with a transmission gate 23 between the input 22 and master latch 26 and a transmission gate 27 between the master latch 26 and slave latch 28. At the output end, there is a data output 29 and a scan output 39, the scan output being enabled by the scan enable signal. The behaviour of the flop is thus, controlled by the state of the scan enable se input. If se is high, then the flop is in shift mode and the data can be scanned though the flop via the scan input 32 and scan output 39 ports. If se is low, then the flop is in functional mode and behaves as a normal master slave flop. In both states the clock clk input is used to update the state of the flop.

The advantage of the design of the mux-D flop of FIG. 1 is that it allows for scan by simply providing a 2-input multiplexer at the input, an extra logic gate at the output and an extra control signal. Thus, the increase in circuit area required for this design is small. A disadvantage of the design is that the multiplexer impacts the functional path performance. Furthermore, clocked scan flip flops are more suited to high speed operation and generally provide lower power consumption than the Mux-D flip-flop designs.

Clocked-scan and LSSD are other well known techniques that allow for scan. These do not have the performance impact of the multiplexer on the functional path. However, they increase the area of the multiplexer by adding an additional latch and some extra clock inputs. Thus, circuit area is typically increased by 30-50% compared to the mux-D approach.

FIG. 2 shows a 3 latch clocked scan flop according to the prior art. As can be seen the functional path between data input 22 and data output 29 is unaffected by this design, thus, functional operation is good. However, this is at a cost of circuit area, in this design and additional latch and an additional scan clock signal have been provided. This gives and increase in area of approximately 33% compared to the mux-D approach.

U.S. Pat. No. 6,380,780 addressed the problem of scan flip-flop designs either increasing area by a large amount or reducing performance and proposes a design having only two latches, but having additional transistors. The design has the drawback of requiring at least four control or clock signals to affect the correct functionality.

SUMMARY

Viewed from one aspect, a circuit comprises at least one flip flop, said flip flop comprising: a master latch and a slave latch; a data signal input and a scan signal input arranged in parallel to each other and each input comprising a tristateable device; and a scan enable signal input, a functional clock signal input and a scan clock signal input; wherein: in response to a first predetermined value of said scan enable signal indicating a functional mode of operation, said scan input tristateable device is operable to isolate said scan input from said master latch, and said master latch is operable in response to said functional clock to receive data from said data input and to output data to said slave latch and said slave latch is operable in response to said functional clock to receive data from said master latch and to output data at said data output; and in response to a second predetermined value of said scan enable signal indicating a scan mode of operation said data input tristateable device is operable to isolate said data input from said master latch, and said master latch is operable in response to said scan clock to receive data from said scan input and said slave latch is operable in response to said functional clock to receive data from said master latch and to output data at said scan output.

The inventor recognized and addressed the above problems by providing a flop that is controlled by two clock signals and a control signal. The flop has tristateable devices on the data and scan inputs that can select the appropriate input depending on the control signal, and the system is arranged such that the functional clock updates both latches in functional mode and updates the slave latch in both modes, while the master latch is updated by the scan clock in scan mode. Thus, the present design enables scan without providing an additional latch and with just two clock signals and a control signal.

In some embodiments, said scan clock and said functional clock are non-overlapping clocks.

Although it is not a strict requirement that the scan clock and functional clock are non-overlapping it is advantageous to make them so. Clocks that overlap could result in a non-robust design with the difficult task of carefully balancing the clocks. Therefore, the non-overlapped approach is highly desirable as it ensures that the internal race condition of the flop is met and also greatly reduces any possibility of an external race condition even with large amounts of skew between the two clocks. Furthermore, as will become clear from the specific description there are several logically quite simple ways to produce such clocks.

In some embodiments, the clock signals are provided from outside of the circuit, while in others the circuit comprises clock signal generation logic, said clock signal generation logic being operable to receive a clock signal and a scan enable signal and to generate a functional clock signal and a scan clock signal in response to said clock signal and said scan enable signal and to route said scan clock signal to said scan clock signal input of said flip flop and said functional clock signal to said functional clock signal input.

In embodiments, said scan signal input is operable to receive an active scan clock signal in said scan mode of operation and is operable to receive an inactive scan clock signal in said functional mode of operation.

The scan clock signal is inactive during a functional mode of operation but is active during scan mode when it is used to clock the master latch.

In some embodiments, said scan input tristateable device is operable to receive and be clocked by said scan clock signal, said scan clock signal being active in said scan mode of operation and inactive in said functional mode of operation.

An effective yet simple way of ensuring, both that the scanned input is isolated during the functional mode of operation and that the slave latch receives data from the scan input clocked by the scan clock during the scan mode of operation is to provide a tristatable device on the scan input with the scan clock as its control clock. Doing this, provides the required functionality of the system in a simple yet highly effective manner.

In some embodiments, said clock signal generation logic is operable to logically combine said scan enable signal and said clock signal to generate a master latch functional clock signal; wherein said master latch functional clock signal is inactive in response to said scan enable signal having said second predetermined value indicating said scan mode of operation and said master latch functional clock signal comprises said functional clock signal in response to said scan enable signal having said first predetermined value indicating a functional mode of operation; and said master latch is operable to receive and be controlled by said master latch functional clock signal.

One way of enabling the master latch to be clocked by the functional clock in functional mode and yet not be clocked by it in scan mode is to provide a master latch functional clock signal which is made inactive in scan mode.

In some embodiments, said data input tristate inverter is operable to receive and be clocked by said master latch functional clock signal.

This master latch functional clock signal can also be used to clock the data input tristate inverter and thereby ensure that the data input is isolated during scan mode and yet provides a low impedance path during functional mode.

In some embodiments, said master latch comprises a tristate inverter and an inverter arranged in a loop, said tristate inverter being clocked by said master latch functional clock signal.

The above arrangement, provides a latch that is clocked by the functional clock during functional mode. Although it is not necessary to clock the latch, doing so allows the latch to update in functional mode in response to low voltage signals.

In some embodiments, said master latch comprises a doubly tristated inverter and an inverter arranged in a loop, said doubly tristated inverter being clocked by both said master latch functional clock signal and said scan clock signal, said scan clock signal being active in said scan mode of operation and inactive in said functional mode of operation.

An alternative arrangement for the master latch is to provide it with a doubly tristate inverter which is clocked by the functional clock in functional mode and the scan clock in scan mode. Clocking the latch in both modes allows low voltage operation in both functional and scan modes. It does however require a greater area than the previously described embodiment.

In alternative embodiments, said master latch comprises two tristate inverters arranged in a loop, such that said data input is connected at a different point in said loop to said scan input, one of said two tristate inverters being clocked by said master latch functional clock signal and the other of said two tristate inverters being clocked by said scan clock signal, said scan clock signal being active in said scan mode or operation and inactive in said functional mode of operation.

This arrangement is an alternative arrangement which also allows clocking of the loop that is the master latch by the scan clock in scan mode and the functional clock in functional mode. Thus, low voltage operations in both modes are allowed.

In some embodiments the circuit comprises a plurality of flip flops arranged in series such that a scan output of one flip flop is connected to a scan input of a subsequent flip flop, said circuit being operable in response to a reset signal indicating a reset mode to receive a predetermined scan clock signal and a predetermined functional clock signal.

The circuit can be arranged to receive a reset signal and in response to the reset signal predetermined clock signals are provided to control the state of the flip flops.

In some embodiments, in response to receipt of said predetermined clock signals a value at a scan input of a first of said plurality of flip flops is stored in all of said plurality of latches.

If the predetermined clock signal values are chosen appropriately, the flip flops can provide a low impedance path from the scan input to the scan output, such that a value provided at the scan input of a first flip flop will ripple through the flip flops and be stored in all of the latches. This property of the circuit allows for flush through mode of operation and provides a convenient way of setting a known value in the latches at reset. This is a highly valuable tool.

In some embodiments, the circuit comprises a plurality of flip flops arranged in series such that a scan output of one flip flop is connected to a scan input of a subsequent flip flop, said circuit further comprising a reset signal input, said clock generation logic being operable to generate a predetermined functional clock signal and a predetermined scan clock signal in response to said reset signal having a value indicating a reset mode of operation.

In some embodiments, the circuit comprises clock generation logic, such that suitable clock signals to provide a low impedance state in all latches of the flip flops can be generated within the circuit in response to the reset value.

In some embodiments, the circuit comprises reset logic, said reset logic being operable to receive said reset signal and to set said scan signal input to a predetermined value in response to said reset signal.

The reset signal can be used to set the value of the scan input to a known value at reset, such that the value that is stored in the latches at reset is known.

In some embodiments, a scan output of at least one of said plurality of flip flops is connected to a scan input of a subsequent flip flop via an inverter, and in response to receipt of said predetermined functional clock signal and said predetermined scan clock signal a value at said scan input of said at least one of said flip flops is stored in said at least one flip flop and an inverse value of said predetermined value at said scan signal input is stored in said subsequent flip flop.

It may be desirable to store a particular value in one latch and a different value in another. This can be achieved by the simple use of inverters between the flops.

In some embodiments, the circuit comprises a plurality of flip flops arranged in series such that a scan output of one flip flop is connected to a scan input of a subsequent flip flop, said circuit being operable in response to a set signal indicating a set mode to receive a predetermined scan clock signal and a predetermined functional clock signal. In some embodiments, in response to receipt of said predetermined clock signals a value at a scan input of a first of said plurality of flip flops is stored in all of said latches within said plurality of flip flops.

The circuit is arranged such that it can operate in flush through mode in response to a set signal as well as a reset signal.

A method of processing data in functional and diagnostic mode is also provided comprising: receiving a scan enable signal indicating a functional mode of operation, and isolating a scan input using a tristateable device from a master latch in response to said scan enable signal, and in response to a functional clock signal performing the following steps: transferring data from a data input to said master latch; outputting said data from said master latch to a slave latch; and outputting said data from said slave latch to a data output; a data signal input and a scan signal input arranged in parallel to each other and each input comprising a tristateable device; and receiving a scan enable signal indicating a scan mode of operation and isolating a data input from said master latch using a tristateable device in response to said scan enable signal; and in response to a scan clock signal said master latch is operable to receive data from said scan input; and in response to said functional clock signal said slave latch is operable to receive data from said master latch and to output data at a scan output.

A yet further aspect of the technology provides a means for processing data in functional and diagnostic mode comprising: a master storage means and a slave storage means; a data input means for receiving a scan signal input means for receiving a scan signal, said data input means and scan input means being arranged in parallel to each other and each input comprising a tristateable means for selectively isolating said each input from said master storage means; and a scan enable input for receiving a scan enable signal, a functional clock input means for receiving a functional clock signal and a scan clock input for receiving a scan clock signal; wherein: in response to a first predetermined value of said scan enable signal indicating a functional mode of operation, said scan input tristateable means is operable to isolate said scan input means from said master storage means, and said master storage means is operable in response to said functional clock to receive data from said data input means and to output data to said slave storage means and said slave storage means is operable in response to said functional clock to receive data from said master storage means and to output data at said data output means; and in response to a second predetermined value of said scan enable signal indicating a scan mode of operation said data input tristateable means is operable to isolate said data input means from said master storage means, and said master storage means is operable in response to said scan clock to receive data from said scan input and said slave latch is operable in response to said functional clock to receive data from said master storage means and to output data at said scan output means.

The above, and other objects, features and advantages will be apparent from the following detailed description of illustrative embodiments which is to be read in connection with the accompanying drawings.

DESCRIPTION OF NON-LIMITING EXAMPLE EMBODIMENTS

Figure 3:
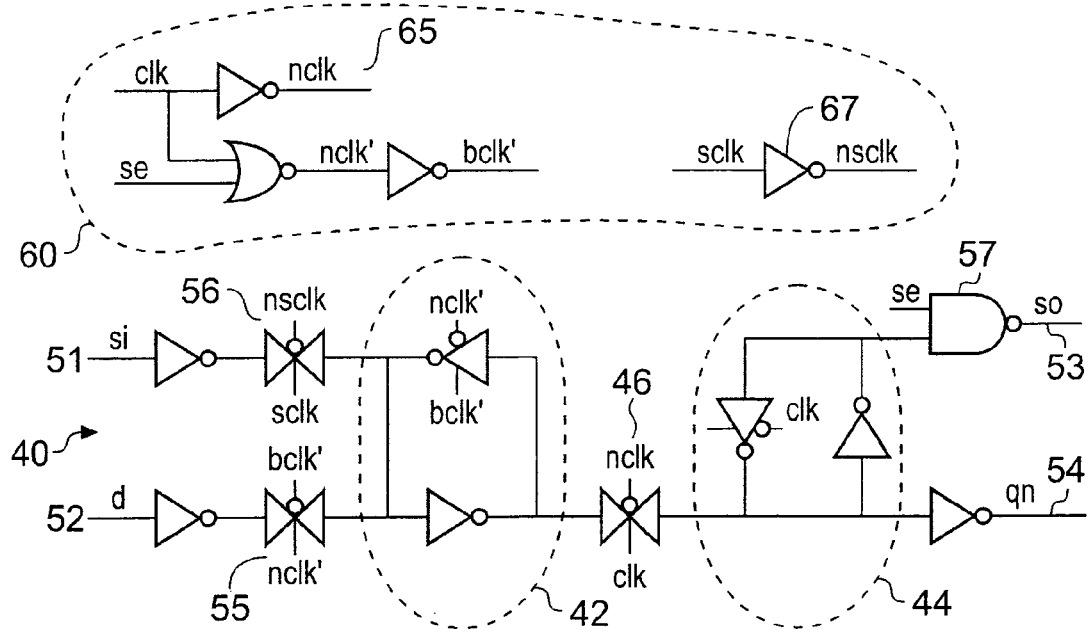
FIG. 3 shows a two latch clocked scan flop and a wave form diagram illustrating how this flop functions according to an example embodiment.
Figure 3:
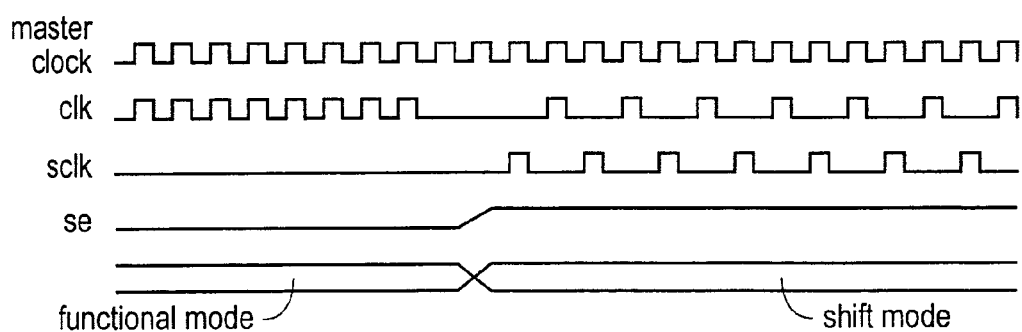

FIG. 3 shows a two latch clocked scan flop 40. Two latch clocked scan flop 40 comprises a master latch 42 and a slave latch 44. These are separated by a transmission gate 46.

The Figure also shows clock generation logic 60 comprising logic 65 operable to generate functional clock signals and logic 67 operable to generate scan clock signals. A waveform diagram demonstrating these clock signals and how the flop functions is also shown.

Figure 1:
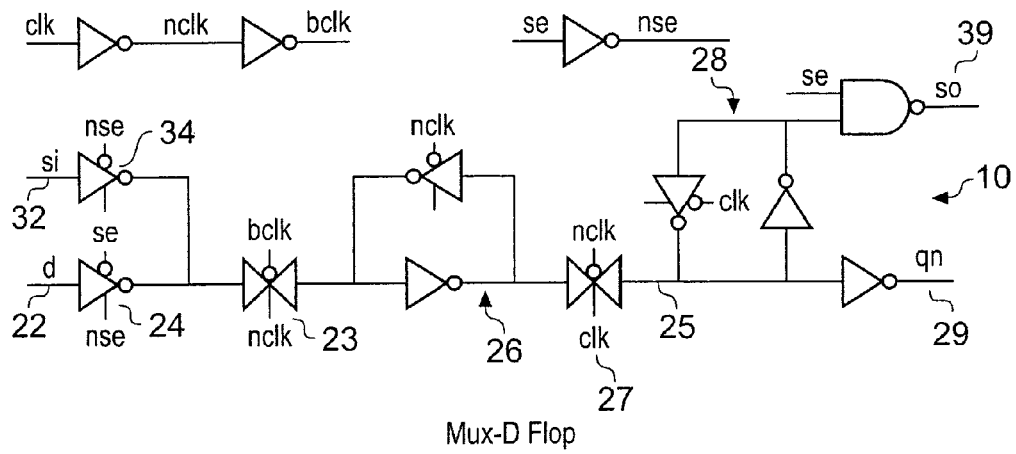
FIG. 1 shows a mux-D flop according to the prior art.

As can be appreciated, there are 38 transistors in this implementation which makes it approximately 5% larger than the mux-D approach in FIG. 1. There is also one additional clock signal—the scan clock signal.

During functional operation the scan enable signal and the scan clock input are held low. Functional clock generation logic 65 provides active clock signals including nclk' and bclk'. In this mode the two latch scan flop 40 functions as a traditional master slave flip flop.

When diagnostic or scan shift mode is required, the clk input is held low and the scan enable signal transitions high. When the scan enable signal is high the nclk' and bclk' signals are forced low and high respectively. This then allows the state of the clk and sclk inputs to control the behaviour of the flip flop. Specifically the functional clock clk input controls the updating of the slave latch, while the scan clock sclk input controls the updating of the master latch.

During scan mode when the scan enable signal is high transmission gate 55 isolates the data input from the master slave 42 while transmission gate 56 provides a low impedance path such that the scan input can update the master latch 42. The transmission gate 56 is clocked by the scan clock and thus the scanned input updates the master latch 42 in response to the transitioning of this clock. Transition gate 46 is clocked by the functional clock, clk, nclk that is not held at a certain value by the scan enable signal and this clocks the data transfer from the master latch 42 to slave latch 44. The scan enable signal holds NAND gate 57 open and allows transfer of the data from the slave latch to the scan output 53.

During functional mode of operation the scan enable signal is low meaning that nclk' and bclk' signals are active. During this mode of operation the scan clock is not active. Thus, transmission gate 56 isolates the scan input 51 from master latch 42 and transmission gate 55 provides a low impedance path between the data input 52 and master latch 42, allowing it to be updated in response to clock signals generated from the functional clock. The transmission gate 46 between the two latches is also clocked by the functional clock and thus the slave latch is updated in response to the functional clock. The scan enable signal is low and thus gate 57 is not open and therefore slave latch 44 outputs its value via data output 54.

It should be noted that the tristateable devices within the latches are clocked by nclk' and bclk' in the case of master latch 42 and nclk and clk in the case of slave latch 44. During scan shift mode nclk' and bclk' are turned off, and thus during this mode master latch 42 is not driven and thus it requires a signal of a reasonably high voltage to switch the states of master latch 42. Thus, in this embodiment low voltage operation in scan shift mode is not supported.

With regard to the waveform diagrams, these show the sclk and clk pulses to be non-overlapped. This is not a strict requirement, but not doing this would result in a non-robust design and it would be a difficult task to carefully balance the clocks. Therefore the non-overlapped approach is highly desirable, as it ensures that the internal race condition of the flip flop is met and also greatly reduces any possibility of an external race condition even with large amounts of skew between the two clocks. Master clock is shown in the waveform diagram and is a constantly active clock that can be used to generate the functional clock and the scan clock signals. This approach requires a clock generation block which receives the master clock and generates a functional and scan clock from it (see FIG. 7). The clock generation block simply requires an input indicating when a transition to shift mode and therefore a scan clock signal is required. In scan mode, the block deletes every other clock pulse of each clock starting after one pulse of set as is shown in the waveform diagram. Many known reference clock generation blocks such as that manufactured by ARM (trademark of ARM limited Cambridge) already has nearly all the logic needed to perform such an operation. It should also be noted that generating the clocks in this way limits the shift operation to half the master clock frequency which should be fast enough for most applications.

Figure 2:
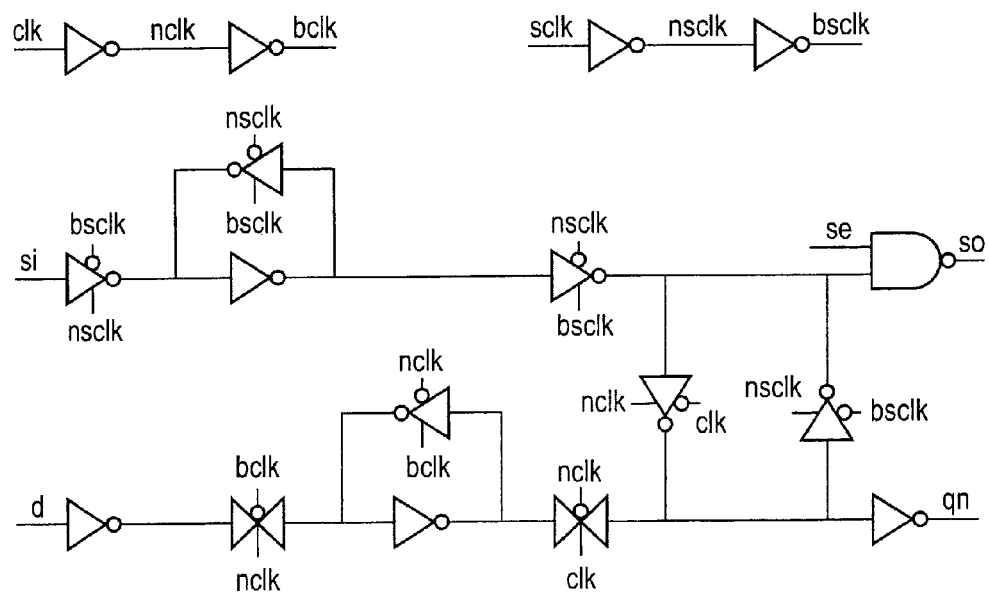
FIG. 2 shows a three latch clocked scan flop according to the prior art.

Both clocks are required as inputs to any block that utilises flip flops as illustrated in FIG. 2. If a design used CTS for clock distribution then both clocks would be distributed in the same fashion. If a high performance clock grid type design was planned then only the clk input needs to be distributed at the high quality level. The sclk could be distributed with a low quality CTS type approach. This would reduce the power consumed during functional operation relative to the three latch clocked scan flop design shown in FIG. 2. This is because main distribution would not have any additional load associated with generating the sclk.

It should also be noted that this approach would allow for the mixing of mux-D and two latch clocked scan structures on scan chains without unreasonable onus on the timing. This would allow a designer to only use the described technology when the timing path is critical and to use the mux-D solution when it is not and thereby save the small area increase.

Figure 4:
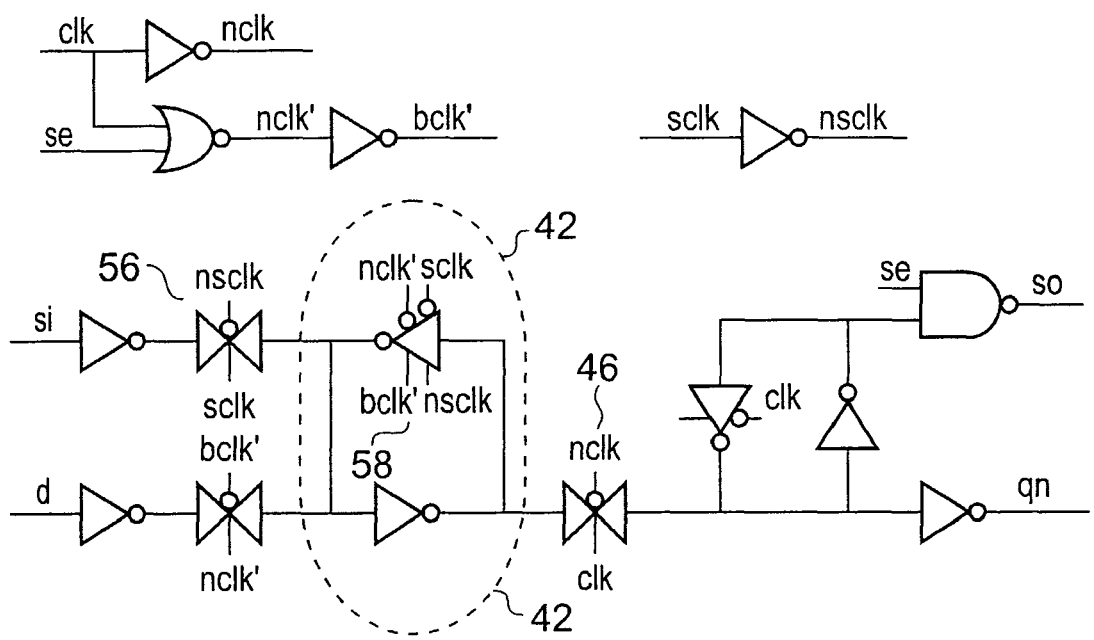
FIG. 4 shows a two latched clocked scan flop according to another example embodiment.
Figure 5:
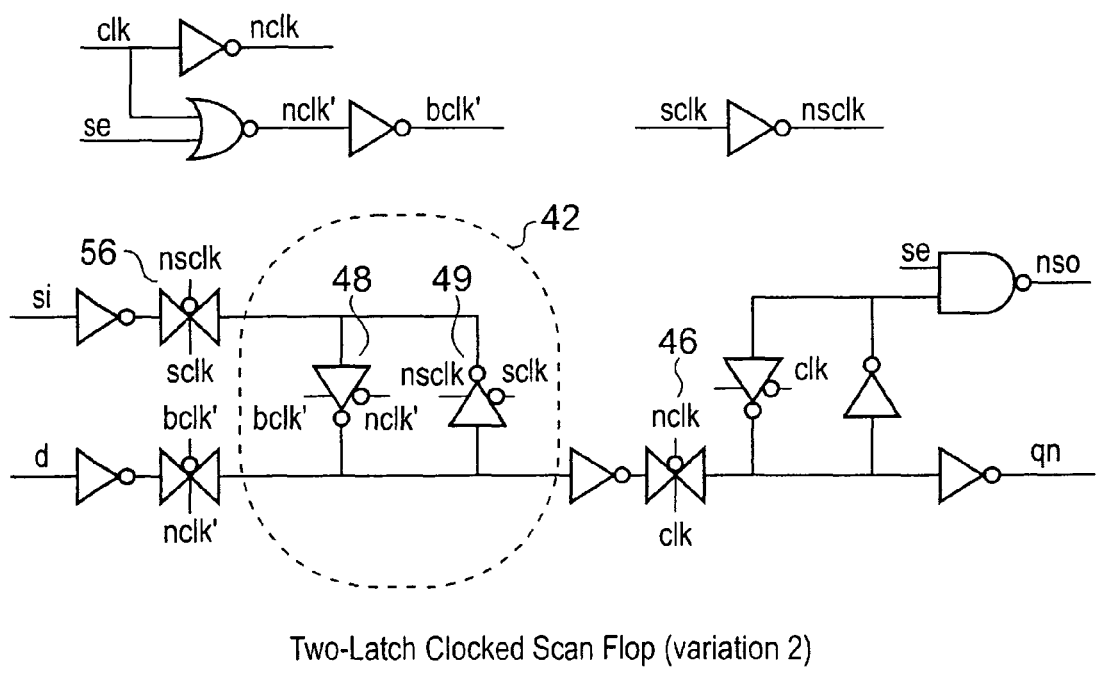
FIG. 5 shows a two latch clocked scan flop according to a further example embodiment.

FIG. 4 and FIG. 5 show alternative embodiments in which low voltage scan mode is supported. FIG. 4 shows master latch 42 having a doubly tristateable device 58 that is clocked by both the functional clock nclk' and bclk' which is operable only in functional mode and by the scan clock sclk and nsclk which is operable only in scan mode. Thus, the slave latch 42 is clocked in both latches and is therefore driven and can change state in response to a low voltage signal. Thus low voltage operation in both scan and functional mode is supported in this embodiment. The disadvantage of such an arrangement is it increases the area cost relative to a mux-D flop to about 11%.

FIG. 5 shows an alternative embodiment in which slave latch 42 has two tristateable devices 48 and 49, tristateable device 48 being clocked by bclk' and nclk' which are only active in functional mode and tristateable device 49 being clocked by scan clock sclk, nsclk which is only active in scan mode. Thus, in this embodiment slave latch 42 is clocked in both modes and therefore supports low voltage operation in both modes.

Figure 6:
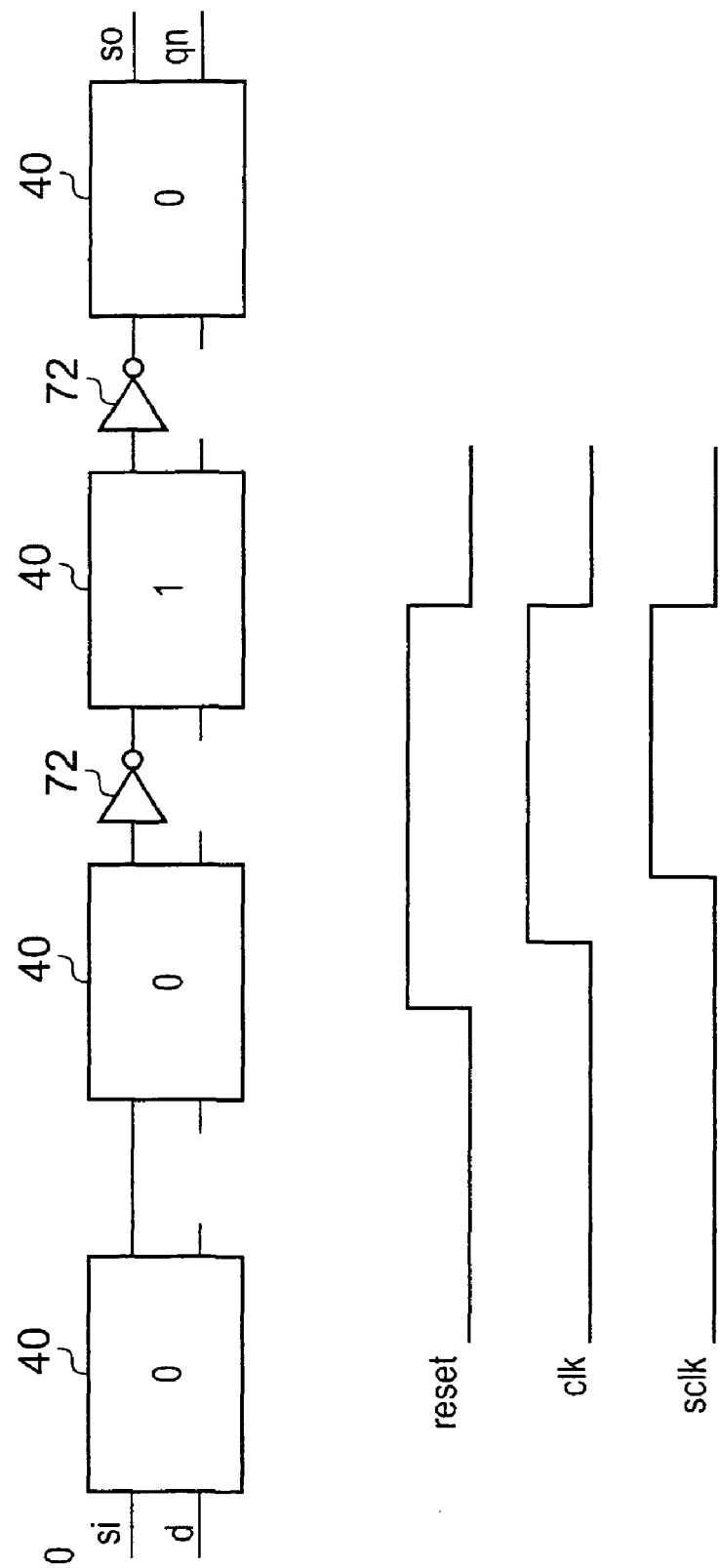
FIG. 6 shows a plurality of clocked scan flops arranged in flush mode according to an example embodiment.

FIG. 6 shows a plurality of flops 40 according to an embodiment arranged in series with their scan inputs connected to each other. An inverter 72 is placed between selected ones of the flip flops 40. Unlike traditional clocked scan flops, the clocked scan flops described in this application also support the flush-through-reset feature normally only available to LSSD flop based designs. This flush mode reset is a method to asynchronously set/reset all scanned flops by setting both the master and slave latches to be transparent from the scan chain point of view. This results in the scan chain being a combinatorial path, and allows all the latches to be set to a value determined by the value at the scan input. To effect this type of reset with a two latch clocked scan flop of an embodiment of the prior art both the clk and sclk inputs are driven high. To avoid any DC path issues the clk input should go high before the sclk input does as is shown the waveform diagram in FIG. 6. To ensure the correct state remains in the flop upon exit of reset, the sclk signal should be brought low before the clk signal is brought low. As can be appreciated from looking at the diagrams of FIG. 3 to FIG. 5, driving both the clk and sclk inputs high results in transmission gate 56 and 46 being open and therefore allows the scan input to be seen by both master latch 42 and slave latch 44.

In this approach, it is the shift input SI that has to overdrive the feedback device in the master latch. Thus, in the embodiment of FIG. 3 that does not support low voltage shift operation, this could be a problem if the scan input was not a high voltage signal. Thus, to operate in flush mode the embodiments of FIG. 4 and FIG. 5 might be preferred.

In the embodiments shown, a zero scan input provides a zero in the first two and last flops 40. As can be seen, the actual values that are stored depend on the input of the scan input and on the inverters 72. Thus, the flip flops 40 can each be arranged to hold a desired value in a very simple manner. This is a particularly useful technique.

Figure 7B:
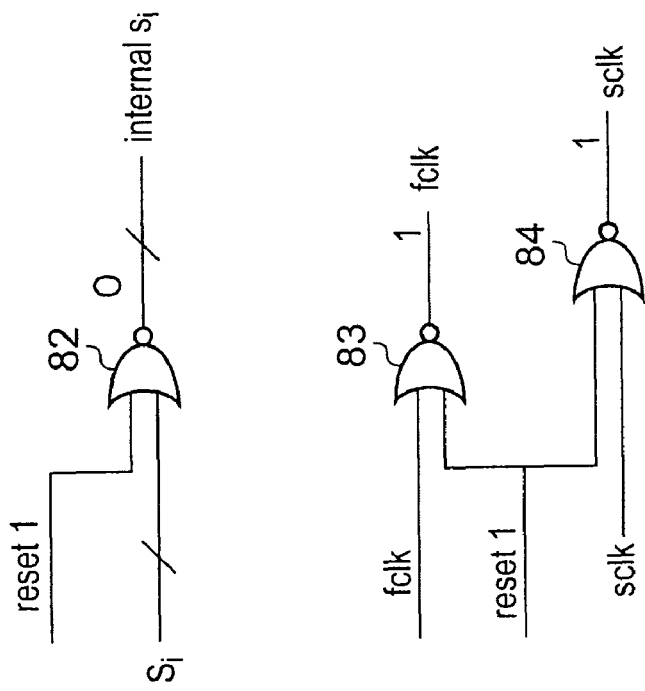
FIGS. 7a and 7b show clock generation logic according to an example embodiment.
Figure 7A:
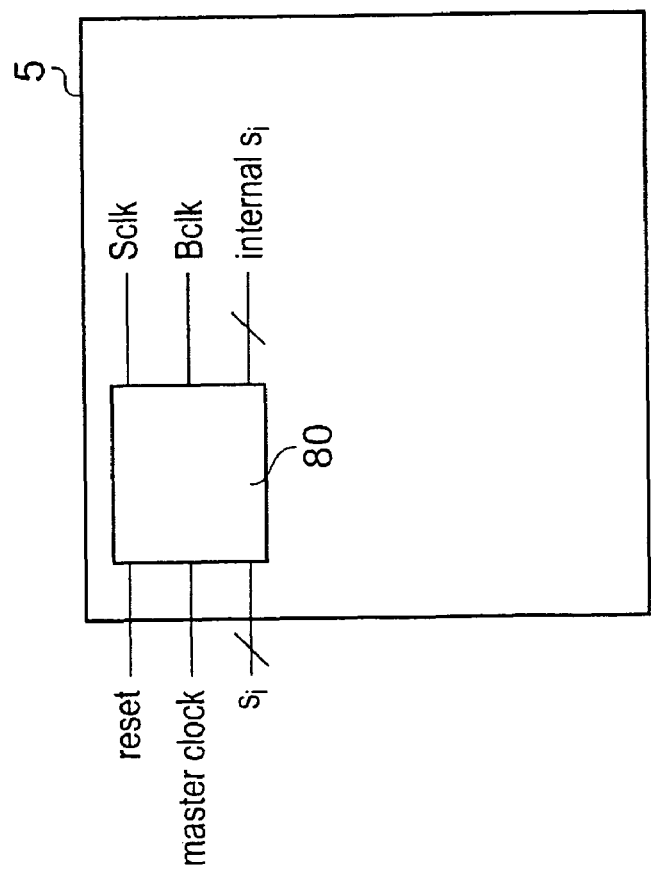

FIG. 7a shows clock signal generation block 80 within a circuit 5 for generating a clock signal for clocking circuits. Clock signal generation logic 80 in this embodiment comprises reset logic. Clock signal generation logic 80 receives a reset signal, a master clock signal, and a plurality of scan input signals on a bus. It generates a scan clock, a functional clock, and an internal scan input signal from these signals. FIG. 7b shows possible logic that could be used to generate the signals. As can be seen, the logic required is very simple. In the case of generating the internal scan input signal in response to a reset signal going high, a NOR gate 82 is used. In the case of driving a functional clock signal and the scan clock signal high in response to a high reset signal two OR gates 83 and 84 are used.

Although in this example embodiment, the reset signal is shown as being high, different semantics could be used with different logic such that a low reset signal could reset the device.

Although illustrative embodiments have been described in detail herein with reference to the accompanying drawings, it is to be understood that the claims are not limited to those embodiments, and that various changes and modifications can be effected therein by one skilled in the art without departing from the scope and spirit of the appended claims.

I claim:
1. A circuit comprising:
a plurality of flip flops,
each of said flip flops including:
  a master latch and a slave latch;
  a data input and a scan input arranged in parallel to each other and each input comprising a tristateable device; and
  a scan enable signal input, a functional clock signal input configured to receive a functional clock and a scan clock signal input configured to receive a scan clock; wherein:

said scan input tristateable device is clocked by said scan clock signal, said data input tristateable device is clocked by said functional clock signal, and said scan input tristateable device and said data input tristateable device are different devices;

in response to a first predetermined value of said scan enable signal indicating a functional mode of operation, said scan input tristateable device is arranged to isolate said scan input from said master latch, and said master latch is arranged in response to said functional clock to receive data from said data input and to output data to said slave latch and said slave latch is arranged in response to said functional clock to receive data from said master latch and to output data at a data output; and in response to a second predetermined value of said scan enable signal indicating a scan mode of operation, said data input tristateable device is arranged to isolate said data input from said master latch, said master latch is arranged in response to said scan clock to receive data from said scan input, and said slave latch is arranged in response to said functional clock to receive data from said master latch and to output data at a scan output, said circuit further comprises a plurality of said flip flops arranged in series such that a scan output of one flip flop is connected to a scan input of a subsequent flip flop, said circuit being arranged in response to a reset signal indicating a reset mode to receive a predetermined signal value of said scan clock and a predetermined signal value of said functional clock, so as to control the state of said plurality of flip flops based on said predetermined scan clock signal value and said predetermined functional clock signal value such that the flip flops are set to a value determined by a value at the scan input of the series.

2. A circuit according to claim 1, wherein said scan clock and said functional clock are non-overlapping clocks.

3. A circuit according to claim 1, said circuit further comprising clock signal generation logic, said clock signal generation logic being operable to receive a clock signal and a scan enable signal and to generate a functional clock signal and a scan clock signal in response to said clock signal and said scan enable signal and to route said scan clock signal to said scan clock signal input of said flip flop and said functional clock signal to said functional clock signal input.

4. A circuit according to claim 3, said clock signal generation logic being operable to logically combine said scan enable signal and said clock signal to generate a master latch functional clock signal; wherein said master latch functional clock signal is inactive in response to said scan enable signal having said second predetermined value indicating said scan mode of operation and said master latch functional clock signal comprises said functional clock in response to said scan enable signal having said first predetermined value indicating a functional mode of operation; and said master latch is operable to receive and be controlled by said master latch functional clock signal.

5. A circuit according to claim 4, wherein said data input tristate inverter is operable to receive and be clocked by said master latch functional clock signal.

6. A circuit according to claim 4, wherein said master latch comprises a singly tristated inverter and an inverter arranged in a loop, said singly tristated inverter being clocked by said master latch functional clock signal.

7. A circuit according to claim 4, wherein said master latch comprises a doubly tristated inverter and an inverter arranged in a loop, said doubly tristated inverter being clocked by both said master latch functional clock signal and said scan clock signal, said scan clock signal being active in said scan mode of operation and inactive in said functional mode of operation.

8. A circuit according to claim 4, wherein said master latch comprises two tristate inverters arranged in a loop, such that said data input is connected at a different point in said loop than said scan input, one of said two tristate inverters being clocked by said master latch functional clock signal and the other of said two tristate inverters being clocked by said scan clock signal, said scan clock signal being active in said scan mode of operation and inactive in said functional mode of operation.

9. A circuit according to claim 3, said circuit further comprising a reset signal input, said clock generation logic being operable to generate a predetermined functional clock signal and a predetermined scan clock signal in response to said reset signal having a value indicating a reset mode of operation.

10. A circuit according to claim 9, comprising reset logic, said reset logic being operable to receive said reset signal and to set said scan signal input to a predetermined value in response to said reset signal.

11. A circuit according to claim 1, wherein said scan input is operable to receive an active scan clock signal in said scan mode of operation and is operable to receive an inactive scan clock signal in said functional mode of operation.

12. A circuit according to claim 1, wherein said scan input tristateable device is operable to receive and be clocked by said scan clock signal, said scan clock signal being active in said scan mode of operation and inactive in said functional mode of operation.

13. A circuit according to claim 1, wherein in response to receipt of said predetermined clock signals a value at a scan input of a first of said plurality of flip flops is stored in all of said latches within said plurality of flip flops.

14. A circuit according to claim 1, wherein a scan output of at least one of said plurality of flip flops is connected to a scan input of a subsequent one of said plurality of flip flop via an inverter, and in response to receipt of said predetermined functional clock signal and said predetermined scan clock signal a value at said scan input of said at least one of said plurality of flip flops is stored in said at least one of said plurality of flip flops and an inverse value of said predetermined value at said scan signal input is stored in said subsequent one of said plurality of flip flop.

15. A circuit according to claim 1, said circuit being operable in response to a set signal indicating a set mode to receive said predetermined scan clock signal and said predetermined functional clock signal.

16. A circuit according to claim 15, wherein in response to receipt of said predetermined clock signals a value at a scan input of a first of said plurality of flip flops is stored in all of said latches within said plurality of flip flops.

17. A method of processing data using a flip flop in functional and diagnostic mode comprising:

receiving a scan enable signal indicating a functional mode of operation, and isolating a scan input using a scan input tristateable device from a master latch in response to said scan enable signal, said scan input tristateable device being clocked by a scan clock signal, and in response to a functional clock signal performing the following steps:

transferring data from a data input to said master latch, said data input arranged in parallel with said scan input;

outputting said data from said master latch to a slave latch;
outputting said data from said slave latch to a data output; and receiving a scan enable signal indicating a scan mode of operation and isolating said data input from said master latch using a data input tristateable device in response to said scan enable signal, said data input tristateable device being clocked by said functional clock signal;

wherein said scan input tristateable device and said data input tristateable device are different devices, in response to the scan clock signal, said master latch receiving data from said scan input; and in response to said functional clock signal, said slave latch receiving data from said master latch and to output data at a scan output, wherein in response to a reset signal indicating a reset mode, the method further includes controlling the state of a plurality of said flip flops arranged in series such that a scan output of one flip flop is connected to a scan input of a subsequent flip flop based on a predetermined signal value of said scan clock signal and a predetermined signal value of said functional clock signal allowing the flip flops to be set to a value determined by a value at the scan input of the series.

18. Apparatus for processing data in functional and diagnostic mode comprising a flip flop comprising:

a master storage means and a slave storage means;

a data input means for receiving a data signal and a scan signal input means for receiving a scan signal, said data input means and scan input means being arranged in parallel to each other and each input comprising a tristateable means for selectively isolating said each input from said master storage means; and a scan enable input means for receiving a scan enable signal, a functional clock input means for receiving a functional clock signal, and a scan clock input means for receiving a scan clock signal; wherein:

said scan input tristateable device is clocked by said scan clock signal, said data input tristateable device is clocked by said functional clock signal, and said scan input tristateable device and said data input tristateable device are different devices;

in response to a first predetermined value of said scan enable signal indicating a functional mode of operation, said scan input tristateable means is operable to isolate said scan input means from said master storage means, and said master storage means is operable in response to said functional clock to receive data from said data input means and to output data to said slave storage means and said slave storage means is operable in response to said functional clock to receive data from said master storage means and to output data at a data output means;

in response to a second predetermined value of said scan enable signal indicating a scan mode of operation said data input tristateable means is operable to isolate said data input means from said master storage means, and said master storage means is operable in response to said scan clock to receive data from said scan input means and said slave storage means is operable in response to said functional clock to receive data from said master storage means and to output data at a scan output means; and wherein said apparatus further comprises a plurality of said flip flops arranged in series such that a scan output means of one flip flop is connected to a scan input means of a subsequent flip flop, said apparatus being operable in response to a reset signal indicating a reset mode to receive a predetermined value of said scan clock signal and a predetermined value of said functional clock signal so as to control the state of said plurality of flip flops based on said predetermined scan clock signal and said predetermined functional clock signal such that the flip flops are set to a value determined by a value at the scan signal input means of the series.

* * * * *